(12) United States Patent
New et al.

(10) Patent No.: US 6,573,749 B2
(45) Date of Patent: Jun. 3, 2003

(54) METHOD AND APPARATUS FOR INCORPORATING A MULTIPLIER INTO AN FPGA

(75) Inventors: Bernard J. New, Los Gatos, CA (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/043,958

(22) Filed: Jan. 8, 2002

(65) Prior Publication Data

US 2002/0057104 A1 May 16, 2002

Related U.S. Application Data

(62) Division of application No. 09/574,714, filed on May 18, 2000.

(51) Int. Cl.⁷ .......................... H03K 19/177; G06F 7/44
(52) U.S. Cl. .............................. 326/41; 326/39; 708/232
(58) Field of Search ...................... 326/41, 47, 37–39, 326/101; 708/230, 232, 234, 620, 623, 625

(56) References Cited

U.S. PATENT DOCUMENTS

| | | | |
|---|---|---|---|
| 4,680,628 A | | 7/1987 | Wojcik et al. |
| 5,095,523 A | * | 3/1992 | Delaruelle et al. ............ 712/42 |
| 5,455,525 A | | 10/1995 | Ho et al. |
| 5,600,265 A | | 2/1997 | El Gamal et al. |
| 5,724,276 A | | 3/1998 | Rose et al. |
| 5,754,459 A | | 5/1998 | Telikepalli |
| 5,828,229 A | | 10/1998 | Cliff et al. |
| 5,883,525 A | | 3/1999 | Tavana et al. |
| 5,914,616 A | | 6/1999 | Young et al. |
| 5,933,023 A | | 8/1999 | Young |
| 6,014,684 A | * | 1/2000 | Hoffman ..................... 708/620 |
| 6,069,490 A | * | 5/2000 | Ochotta et al. ............... 326/41 |
| 6,100,715 A | | 8/2000 | Agrawal et al. |
| 6,249,144 B1 | | 6/2001 | Agrawal et al. |
| 6,457,116 B1 | * | 9/2002 | Mirsky et al. ................ 712/16 |

OTHER PUBLICATIONS

The Programmable Logic Data Book 1999, available from Xilinx, Inc., 2100 Logic Drive, San Jose, California 95124.

* cited by examiner

*Primary Examiner*—Don Le
*Assistant Examiner*—James H. Cho
(74) *Attorney, Agent, or Firm*—William L. Paradice, III; Edel M. Young

(57) ABSTRACT

One or more columns of multi-function tiles are positioned between CLB tiles of the FPGA array. Each multi-function tile includes multiple function elements that share routing resources. In one embodiment, a multi-function tile includes a configurable, dual-ported RAM and a multiplier that share routing resources of the multi-function tile. The RAM includes first and second input ports coupled to first and second input data buses, respectively, and includes first and second output ports coupled to first and second output data buses, respectively. The multiplier includes first and second operand ports coupled to receive operands from the first and second input data buses, and in response thereto provides a product. In one embodiment, the most significant bits (MSBs) of the product are selectively provided to the first output data bus using bus multiplexer logic, and the least significant bits (LSBs) of the product are selectively provided to the second output data bus using bus multiplexer logic.

19 Claims, 6 Drawing Sheets

METHOD AND APPARATUS FOR INCORPORATING A MULTIPLIER INTO AN FPGA

FIELD OF THE INVENTION

This invention relates generally to programmable logic devices and specifically to multiplication functions in a field programmable gate array (FPGA).

BACKGROUND OF THE INVENTION

A Field Programmable Gate Array (FPGA) is a general purpose device that can be programmed by an end user to perform one or more selected functions. An FPGA typically includes an array of individually configurable logic blocks (CLBs), each of which is programmably interconnected to other CLBs and to input/output (I/O) pins via a programmable routing structure to provide the selected function. U.S. Pat. No. 5,883,525, issued Mar. 16, 1999 to Tavana et al, and incorporated herein by reference, discloses an FPGA architecture having a plurality of repeatable cores tiles surrounded by I/O tiles. Each core tile has a CLB and a programmable routing matrix. The tiles are programmably interconnected to each other via their programmable routing matrices. U.S. Pat. No. 5,933,023, issued Aug. 3, 1999 to Young, and incorporated herein by reference, discloses an FPGA architecture having columns of blocks of random access memory (RAM) interposed between columns of core tiles to provide RAM functions to the FPGA. The RAM blocks each include a programmable routing matrix of the type in the core tiles, and may be accessed by the CLBs using dedicated connect lines rather than the general interconnect structure. U.S. Pat. No. 5,914,616 to Young et al describes an FPGA architecture in which logic blocks are connected to switch matrices through input and output multiplexers, and is incorporated herein by reference. Other suitable FPGA architectures are described in The Xilinx 1999 Data Book entitled "The Programmable Logic Data Book", available from Xilinx, Inc., 2100 Logic Drive, San Jose, Calif. 95124.

As known in the art, each CLB of an FPGA is individually programmable to perform a variety of logic functions, such as addition. Many CLBs can be configured together to implement more complex logic functions, ranging from simple multipliers to more complex microprocessors. For example, U.S. Pat. No. 5,754,459, issued May 19, 1998 to Telikepalli, and incorporated by reference herein, teaches implementing a multiplier circuit using a number of CLBs in an FPGA architecture. However, implementing a multiplier using CLBs of an FPGA architecture may require a significant number of CLBs. For example, in the Virtex family of FPGAs available from Xilinx, Inc., implementing a 16×16 multiplier requires at least 60 CLBs. Implementing a multiplier in this manner not only consumes valuable CLB resources, but also consumes valuable general interconnect resources, which in turn may slow performance of the FPGA device.

One solution is to provide a dedicated multiplier within the FPGA to free valuable CLB resources for other functions. However, multipliers require a significant amount of input and output routing resources, which undesirably increases silicon area of the FPGA. Since it is often necessary to perform multiplication functions in an FPGA, it is would be desirable to implement a multiplier in an FPGA without consuming valuable CLB resources and without significantly increasing silicon area.

SUMMARY OF THE INVENTION

The present invention provides an alternative structure that shares routing resources with a programmable structure having variable width. When the programmable structure is being used only partly, the routing resources for the remaining portion of the programmable structure can be used by the alternative structure, and yet the alternative structure requires almost no additional silicon area for routing resources. In accordance with one embodiment of the present invention, one or more columns of multi-function tiles are positioned between CLB tiles of the FPGA array. Each multi-function tile includes multiple function elements that share I/O routing resources. In one embodiment, the multi-function tile includes a configurable, dual-ported RAM and a multiplier that share I/O resources of the multi-function tile. The RAM includes first and second input ports coupled to first and second input data buses, respectively, and includes first and second output ports coupled to first and second output data buses, respectively. The multiplier includes first and second operand ports coupled to receive operands from the first and second input data buses, and in response thereto provides a product. In one embodiment, the most significant bits (MSBS) of the product are selectively provided onto the first output data bus, and the least significant bits (LSBS) of the product are selectively provided onto the second output data bus.

For this multiplier embodiment, in the configuration mode that uses the multiplier, the multiplier can be accessed simultaneously with reading and writing to the RAM or can be accessed without reading or writing to the RAM. During a write operation to the RAM, the RAM receives a number of LSBs from the first and second input data buses as input data, and the multiplier simultaneously receives a number of MSBs from the first and second input data buses as operands. During a read operation from the RAM, a first data word from the RAM and the MSBs of the product from the multiplier are concatenated onto the first output bus, and a second data word from the RAM and the LSBs of the product from the multiplier are concatenated onto the second output data bus. In this manner, RAM access and multiplication operations may be performed simultaneously.

Like components in the figures are similarly labeled.

DETAILED DESCRIPTION OF THE INVENTION

Embodiments of the present invention are described below in the context of an FPGA for simplicity only. It is to be understood that embodiments of the present invention may be implemented in various FPGA architectures, sizes, configurations, and environments, as may be required by a user. Accordingly, the present invention is not to be construed as limited to specific examples described herein but rather includes within its scope all embodiments defined by the appended claims.

Figure 1:
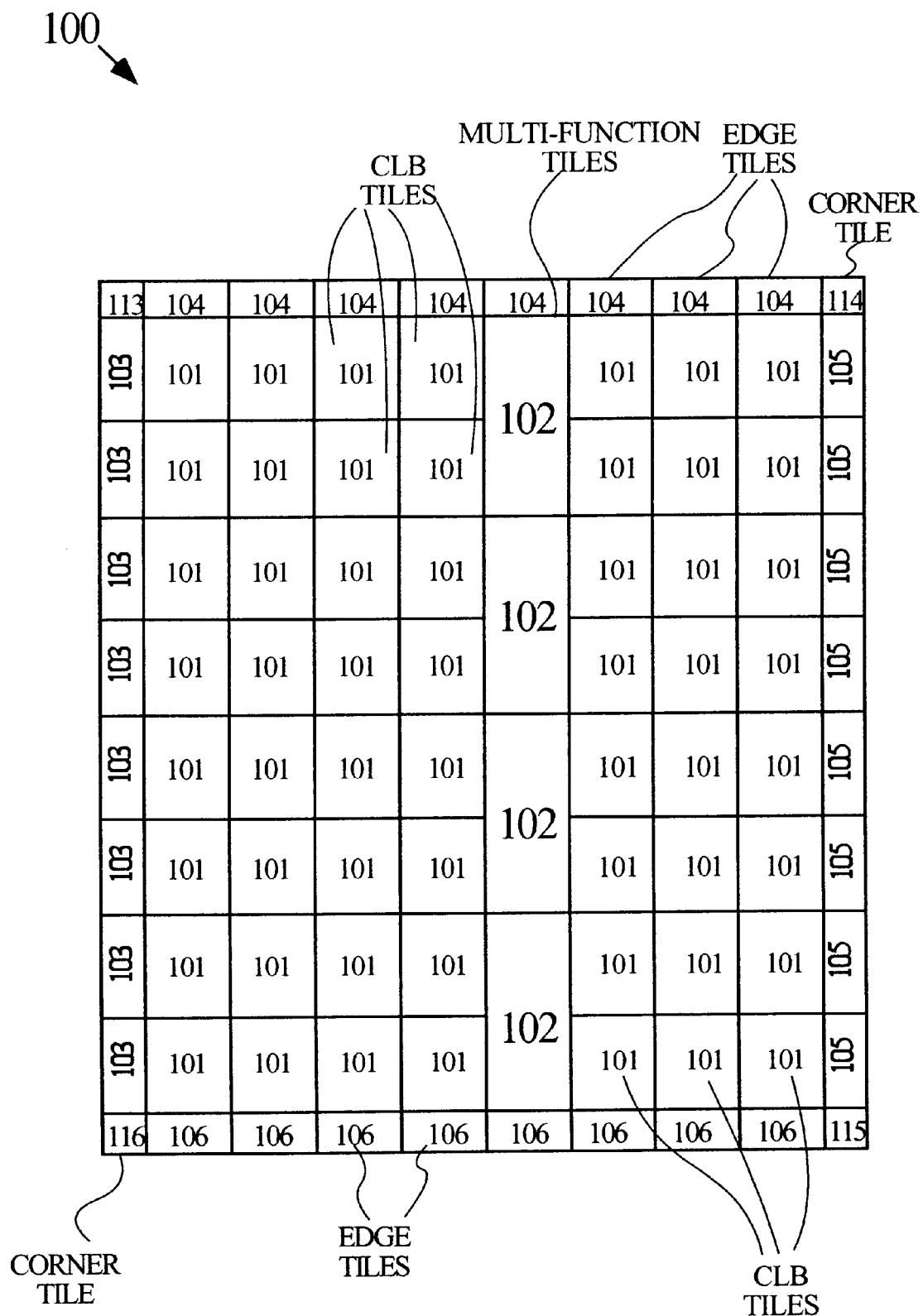
FIG. 1 shows an FPGA architecture which includes multi-function tiles in accordance with the present invention.
Figure 2:
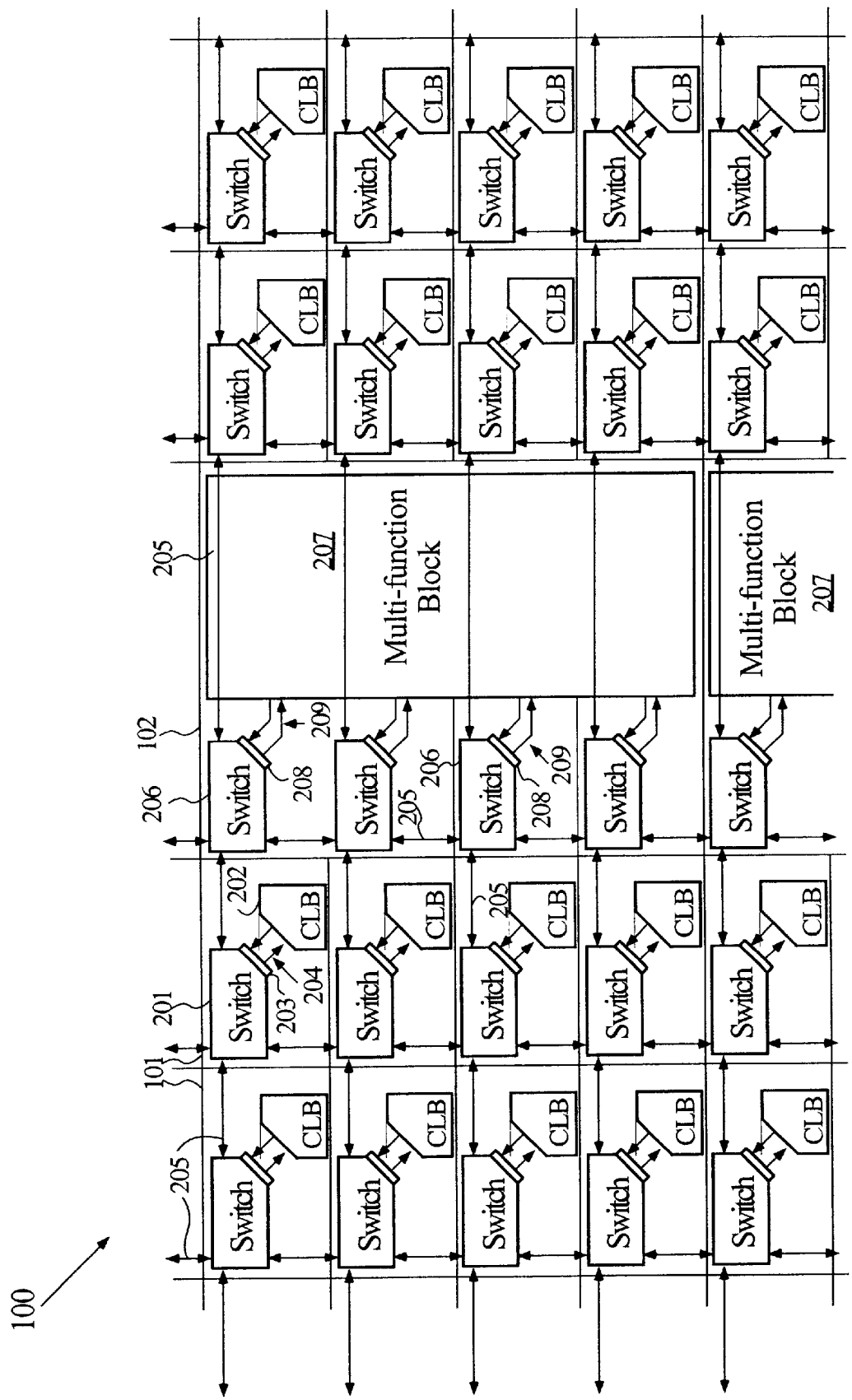
FIG. 2 shows a column of multi-function tiles positioned between a plurality of CLB tile columns in one embodiment of the present invention.

FIG. 1 shows an FPGA 100 having an array of identical CLB tiles 101 surrounded by edge tiles 103–106 and corner tiles 113–116. A column of multi-function tiles 102 is positioned between two columns of CLB tiles 101. Edge tiles 103–106 and corner tiles 113–116 provide programmable interconnections between tiles 101–102 and input/output (I/O) pins (not shown for simplicity) of FPGA 100. FPGA 100 may include any number of CLB tile columns, and each tile column may include any number of CLB tiles 101. Although only one column of multi-function tiles 102 is shown in FIG. 1, some embodiments may have more than one multi-function tile column. Referring also to FIG. 2, each CLB tile 101 includes a switch matrix 201 and a CLB 202. CLB 202 is a well-known, individually programmable CLB such as described in the 1999 Xilinx Data Book. Each switch matrix 201 may be a programmable routing matrix of the type disclosed by Tavana et al. in U.S. Pat. No. 5,883,525, or by Young et al. in U.S. Pat. No. 5,914,616 and provides programmable interconnections to other tiles 101 and 102 in a well-known manner via signal lines 205. The switch matrices 201 in CLB tiles 101 include an interface 203 to provide programmable interconnections to a corresponding CLB 202 via signal buses 204. In some embodiments, CLBs 202 may be directly connected to CLBs 202 in adjacent tiles, for instance, as described in U.S. Pat. No. 5,883,525. Other well-known elements of FPGA 10 are omitted from FIG. 1 for simplicity.

Each multi-function tile 102 is shown in FIG. 2 as extending over four tile rows of FPGA 100, and includes four switch matrices 206 and a multi-function block 207. The four switch matrices 206 provide programmable interconnections to each other and to CLB tiles 101 in corresponding rows via signal buses 205. Each switch matrix 206 in multi-function tile 102 includes an interface 208 to provide programmable interconnections to multi-function block 207 via signal buses 209. Thus, for each multifunction tile 102, multi-function block 207 receives four groups of signals from the four corresponding switch matrices 206. In other embodiments, multi-function block 207 may extend over any number of tile rows, and thus may include any number of switch matrices 206 to interface with adjacent CLB tiles 101. As explained below, multi-function block 207 may include multiple circuits or logic elements that share routing resources of corresponding switch matrices 206 to allow for additional FPGA functionality while conserving routing resources.

Figure 3:
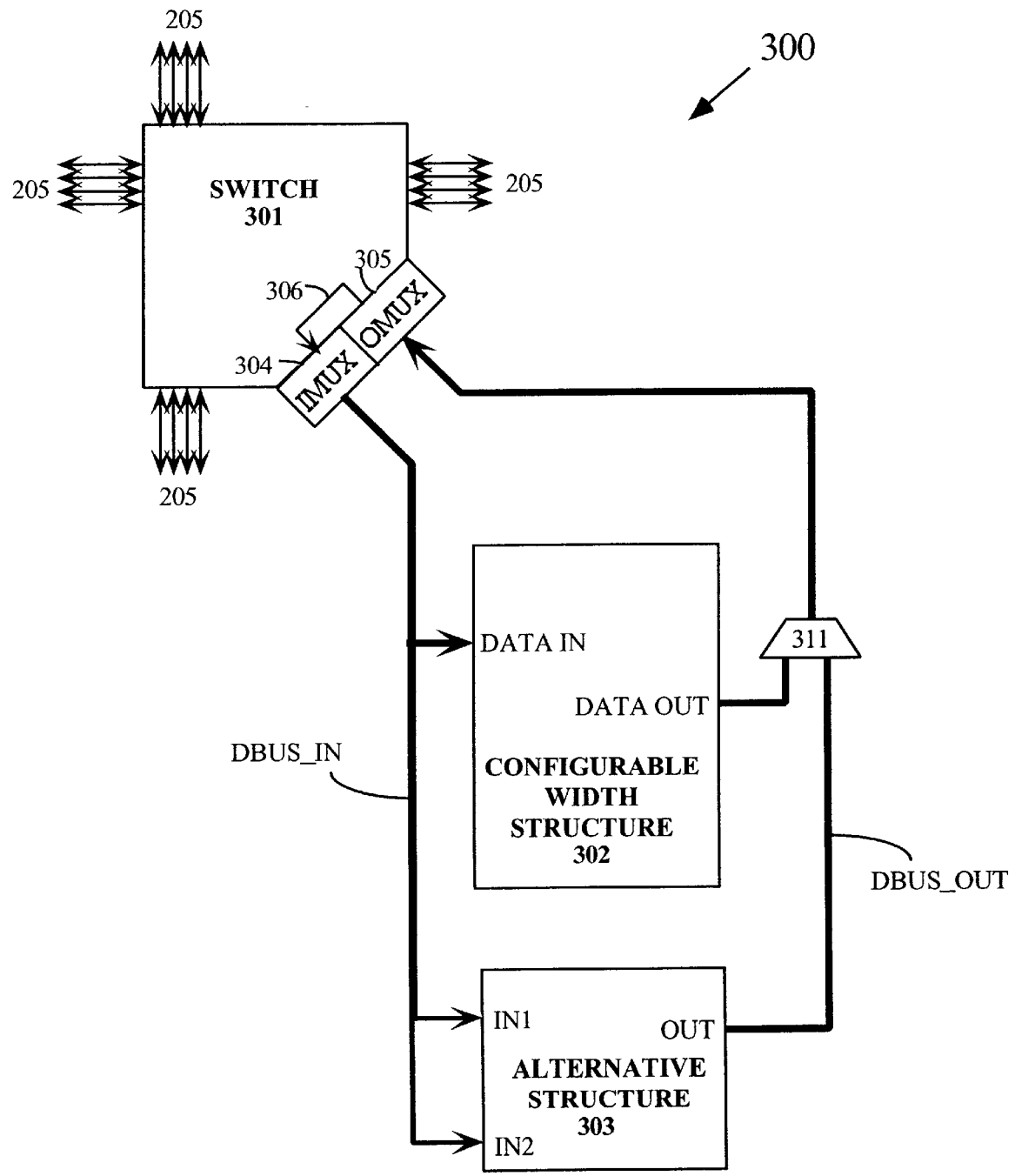
FIG. 3 shows a multi-function tile including a switch routing matrix, variable width structure, and alternative structure in accordance with the present invention.

FIG. 3 shows a tile 300 that is one embodiment of tile 102 of FIG. 2. Tile 300 includes a switch matrix 301, a variable width structure 302, and an alternative structure 303. Switch matrix 301 may include the four switch matrices 206 shown in tile 102 in FIG. 2, and is shown in FIG. 3 to include an input multiplexer (IMUX) 304 and an output multiplexer (OMUX) 305 having a signal bus 306 coupled therebetween. An input data bus DBUS_IN connects IMUX 304 to variable width structure 302 and alternative structure 303. An output data bus DBUS_OUT connects OMUX 305 to variable width structure 302 and alternative structure 303. Variable width structure 302 may be any suitable device, including RAM, EEPROM, EPROM, registers, and so on. Alternative structure 303 may be any suitable dedicated circuit known in the art. In one embodiment, alternative structure 303 is a well-known signed multiplier. In other embodiments, alternative structure 303 may be an unsigned multiplier, a divider, an adder, a code converter, or some other structure selected by the FPGA architect.

During operation, data may be selectively routed using IMUX 304 to variable width structure 302 for a programmable width function, to alternative structure 303 for a dedicated function, or to both. Similarly, data may be selectively read using OMUX 305 from variable width structure 302 for a read operation, or read from alternative structure 303 as selected by multiplexer 311. Since alternative structure 303 shares routing resources DBUS_IN, DBUS_OUT, and switch matrix 301 with variable width structure 302, the addition of alternative structure 303, which advantageously provides a dedicated function without using CLB resources, does not require its own I/O structure, which in turn conserves valuable silicon area. The size of alternative structure 303 is typically small relative to the size of switch 301, and thus minimally increases silicon area.

The illustration in FIG. 3 shows that alternative structure 303 receives two input values IN1 and IN2 from input data bus DBUS_IN because many desired alternative functions calculate a function from two input values. However, the invention does not require that alternative structure 303 receive two input values. If alternative structure 303 were a register driven by an alternative clock, for example, the input value would not be divided as shown in FIG. 3. Other functions may require more than two input values.

Figure 4:
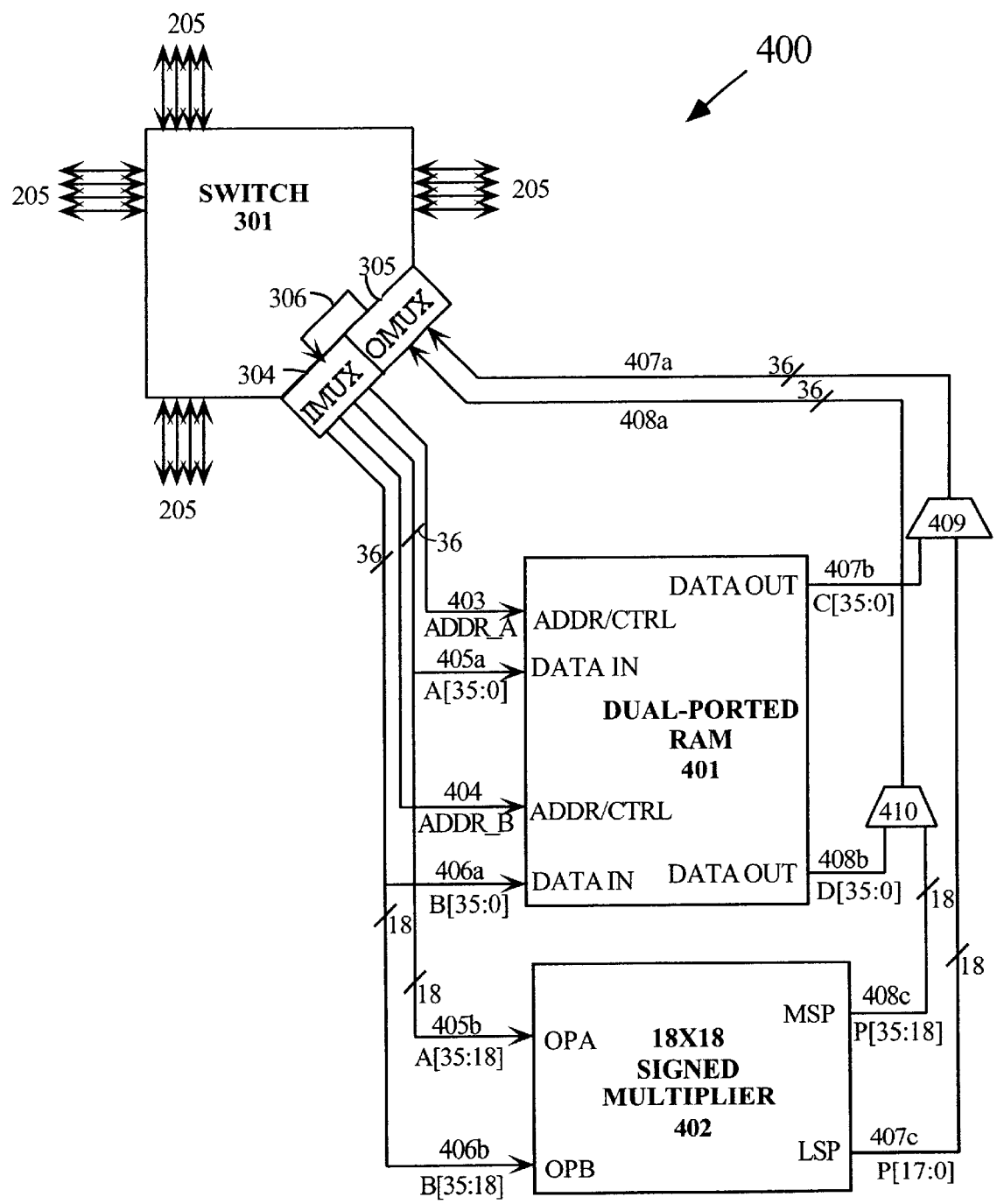
FIG. 4 shows one embodiment of the multi-function tile of FIG. 3.

FIG. 4 shows an exemplary multi-function block 400 in accordance with one embodiment of the present invention. Multi-function block 400 includes switch matrix 301, a configurable dual-ported RAM 401, and an 18×18 signed multiplier 402.

IMUX 304 provides a first address ADDR_A and associated control signals to a first address/control port of RAM 401 via a bus 403, and provides a corresponding first 36-bit data signal A[35:0] to a first data input port of RAM 401 via a 36-bit bus 405(a). IMUX 304 provides a second address ADDR_B and associated control signals to a second address/control port of RAM 401 via a bus 404, and provides a corresponding 36-bit data signal B[35:0] to a second data input port of RAM 401 via a 36-bit bus 406(a). The 18 MSBs of data signal A, A[35:18], are provided to a first operand port of multiplier 402 via an 18-bit bus 405(b), and the 18 MSBs of data signal B, B[35:18], are provided to a second operand port of multiplier 402 via an 18-bit bus 406(b).

OMUX 305 is coupled to two 36-bit data output buses 407(a) and 408(a). A first data output port of RAM 401 provides a 36-bit output data word C[35:0] to a 36-bit bus 407(b), which in turn is coupled to bus 407(a) via multiplexer 409. A second data output port of RAM 401 provides a 36-bit output data word D[35:0] to a 36-bit bus 408(b), which in turn is coupled to bus 408(a) via multiplexer 410. Multiplier 402 provides the 18 LSBs of its product, P[17:0], to multiplexer 409 on an 18-bit bus 407(c), and provides the 18 MSBs of its product, P[35:18], to multiplexer 410 on an 18-bit bus 408(c). Buses 407 and 408 correspond to DBUS_OUT in FIG. 3.

Multiplexer 409 selectively concatenates (see FIG. 5, discussed below) the 18 LSBs of output data signal C from RAM 401 with either the 18 MSBs of signal C or the 18 LSBs P[17:0] from multiplier 402 to provide a 36-bit signal to OMUX 305 via bus 407(a). Similarly, multiplexer 410 selectively concatenates the 18 LSBs of output data signal D from RAM 401 with either the 18 MSBs of signal D or the 18 MSBs P[35:18] from multiplier 402 to provide a 36-bit signal to OMUX 305 via bus 408(a). As described below, multiplexers 409 and 410 allow RAM 402 and multiplier 402 to share output resources in OMUX 305.

Figure 5:
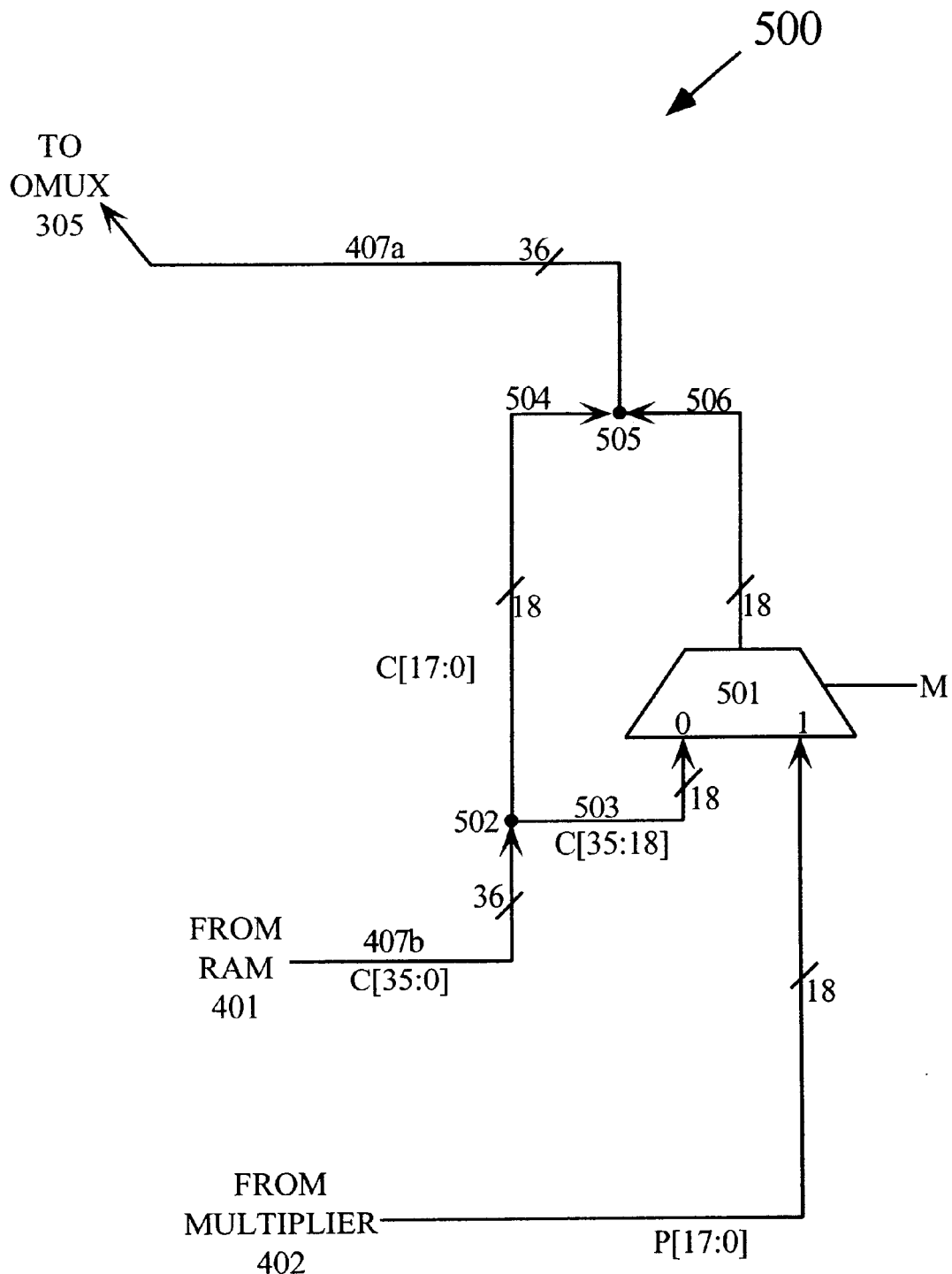
FIG. 5 is a circuit diagram of bus logic used in one embodiment of the multi-function tile of FIG. 4.

FIG. 5 shows bus logic 500 that is one embodiment of multiplexers 409 and 410. Bus logic 500 is described with reference to multiplexer 409 for simplicity, and is equally applicable to multiplexer 410. Bus logic 500 includes a multiplexer 501 having first 18-bit input port "0", a second 18-bit input port "1", an 18-bit output port, and a control terminal to receive a mode signal M. Mode signal M may be a static bit stored by a configuration memory cell or may be an active signal provided by other tiles 101 and/or 102. The 36-bit signal C[35:0] provided from RAM 401 via bus 407(b) is divided at node 502. The MSBs C[35:18] are provided to the "0" input port of MUX 501 via an 18-bit bus 503, and the LSBs C[17:0] are provided to node 505 via an 18-bit bus 504. The LSBs P[17:0] are provided to the "1" input port of MUX 501 via a bus 407(c). In response to mode signal M, MUX 501 provides either C[35:0] or P[17:0] on an 18-bit bus 506 to be concatenated with C[17:0] at node 505, which in turn provides the resultant 36-bit signal to OMUX 305 via bus 407(a).

RAM 401 may be configured to operate in several different modes including, for instance, as a 512×36 array or as a 1028×18 array, and other desirable configurations may also be used. In a first configuration mode, RAM 401 is configured to operate as a 1028×18 array, and as explained below allows for simultaneous read/write operations in RAM 401 and multiplication functions in multiplier 402. In some embodiments, the configuration mode of RAM 401 is user-selectable.

In the first mode, RAM 401 uses only 18 bits of 36-bit input buses 405(a) and 406(a). Here, the data signal A[35:0] may include a first 18-bit operand A[35:18] and a first 18-bit data word A[17:0], and the data signal B[35:0] may include a second 18-bit operand B[35:18] and a second 18-bit data word B[17:0]. For example, during a write operation to RAM 401, A[35:0] and B[35:0] are provided on buses 405(a) and 406(a) respectively, and addresses ADDR_A and ADDR_B are provided on buses 403 and 404, respectively. A[17:0] is latched into the first data port of RAM 401 and thereafter written to a location selected by ADDR_A, and B[17:0] is latched into the second data port of RAM 401 and thereafter written to a location selected by ADDR_B. This RAM write operation may be used independently and at the same time as A[35:18] and B[35:18] are being provided as operands to multiplier 402 via buses 405(b) and 406(b), respectively, and are being multiplied together to generate the product P[35:0]. Here, by sharing input resources between RAM 401 and multiplier 402, present embodiments advantageously allow for simultaneously writing data to RAM 401 and multiplying operands in multiplier 402.

Multiplexers 409 and 410 allow RAM 401 to read out two 18-bit data words to OMUX 305 while multiplier 402 provides its product P[35:0] to OMUX 305. For example, during a read operation in the first configuration mode, RAM 401 may read out an 18-bit data word C[17:0] to multiplexer 409 via bus 407(b) in response to ADDR_A, and simultaneously read out an 18-bit data word D[17:0] to bus logic 410 via bus 408(b) in response to ADDR_B. At the same time, multiplier 402 provides P[17:0] to bus logic 409 via bus 407(c), and provides P[35:18] to bus logic 410 via bus 408(c). Here, mode signal M is set equal to "1" so that bus logic 409 concatenates P[17:0] and C[17:0] and provides the resultant signal to OMUX 305 via bus 407(a). Similarly, multiplexer 410 concatenates P[35:18] and D[17:0] and provides the resultant signal to OMUX 305 via bus 407(a).

OMUX 305 may be programmed to route the 18 MSBs of signals from buses 407(a) and 408(a) as C[17:0] and D[17:0], respectively, to other tiles 101 and/or 102 in the FPGA architecture. Simultaneously, OMUX 305 may also selectively route the 18 LSBs of signals from buses 407(a) and 408(a) as P[17:0] and P[35:18], respectively, to different other tiles 101 and/or 102. In this manner, data words from RAM 401 and product information from multiplier 402 may be simultaneously read out from multi-function block 400 and provided to other tiles 101 and/or 102 via switch 301. The ability to perform read/write operations concurrently with multiplication operations in multi-function block 400 advantageously allows for access latencies in RAM 401 to be overlapped with gate delays in multiplier 402, thereby improving performance.

Further, OMUX 305 may route RAM output signals C[17:0] and/or D[17:0] from DATA OUT terminals 407b and/or 408b via bus 306 to multiplier 402 where a product P[17:0] and P[35:18] is generated. In this manner, products may be generated using values stored in RAM 401 without consuming routing resources external to multi-function block 400. Alternatively, OMUX 305 may route P[17:0] and P[35:18] from respective buses 407(a) and 408(a) directly to RAM 401 via bus 306 and IMUX 304 for a subsequent write operation to RAM 401. In this manner, the product P[35:0] generated by multiplier 402 may be stored directly in RAM 401 without leaving multi-function block 400 and, again, without consuming valuable routing resources external to multifunction block 400.

In a second configuration mode, RAM 401 is configured to operate as a 512×36 array, and thus uses the full width of input buses 405(a) and 406(b). During a write operation in the second mode, two 36-bit data words A[35:0] and B[35:0] are provided to RAM 401 via corresponding buses 405(a) and 405(b), and thereafter written to locations selected by ADDR_A and ADDR B, respectively. Here, MSB signals A[35:18] and B[35:18] are also provided to multiplier 402, which in response thereto generates P[35:0]. During a read operation, RAM 401 provides a first 36-bit data word C[35:0] to bus logic 409 in response to ADDR_A, and provides a second 36-bit data word D[35:0] to bus logic 410 in response to ADDR_B. Mode signal M is set to "0" so that bus logic 409 and 410 route C[35:0] and D[35:0], respectively, to OMUX 305. Thus, referring also to FIG. 5, in response to M=0, MUX 501 routes C[35:18] to node 505 via bus 506, and C[35:18] and C[17:0] are concatenated at node 505 to provide C[35:0] to OMUX 305 via bus 407(a). Multiplexer 410 routes D[35:0] from RAM 401 to OMUX 305 via bus 408(a) in a similar fashion.

When RAM 401 operates in the second configuration mode, as described above, multiplier 402 will multiply A[35:18] and B[35:18] to generate P[35:0], although P[35:0] cannot be provided to OMUX 305 while RAM 401 outputs data to OMUX 305.

Figure 6:
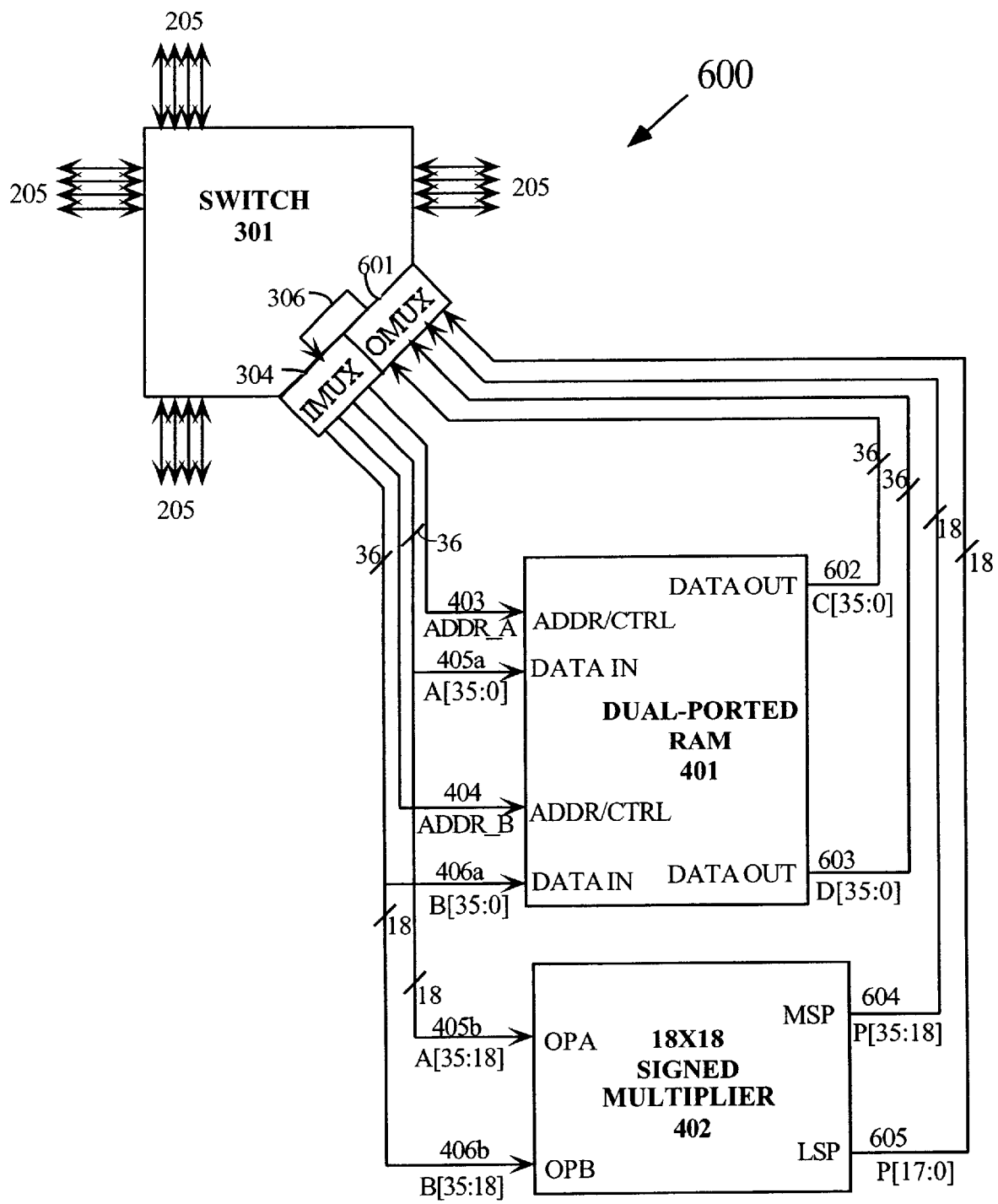
FIG. 6 shows another embodiment of the multifunction tile of FIG. 3.

In other embodiments, OMUX 305 may be expanded to include two additional 18-bit ports to receive product information P[35:0] directly from multiplier 402. For example, FIG. 6 shows a multi-function block 600 that is a modification of the multi-function block 400 of FIG. 4 in which the function of bus logic 409 and 410 is implemented within an expanded OMUX 601. As shown in FIG. 6, 36-bit data words C[35:0] and D[35:0] are provided directly from RAM 401 to OMUX 305 via 36-bit buses 602 and 603, respectively, while P[35:18] and P[17:0] are provided directly from multiplier 402 to OMUX 601 via 18-bit buses 604 and 605, respectively. In this embodiment, OMUX 601 determines which signals on buses 602–605 to route to other tiles 101 and/or 102, or back to RAM 401 via bus 306 and IMUX 304.

In either of the embodiments shown in FIGS. 4 and 6, 18×18 signed multiplier 402 may be used to perform 17×17 unsigned multiplication. As is well known, signed multiplication uses the most significant bit to indicate the sign whereas unsigned multiplication uses no bit to indicate the sign. Since multiplier 402 is designed for signed multiplication, multiplier 402 treats the most significant bit as the sign bit. A zero in this bit indicates a positive number and a one indicates a negative number. To use multiplier 402 for 17×17 unsigned multiplication, it is necessary to fill the most significant (18th) bit with a zero, and this is advantageously performed in such an FPGA by routing a logic zero through switch matrix 301 to the most significant bit line fed by multiplexer 304. Smaller unsigned numbers may also be multiplied by routing logic zero's to fill all unused bits in the multiplier. Also, smaller signed numbers may be multiplied together by routing duplicates of the sign bit to the most significant unused bits.

In other embodiments, multiplier 402 may be some other circuit such as, for instance, an arithmetic logic unit (ALU), that shares I/O resources with RAM 401 to realize advantages described above. In still other embodiments, RAM 401 may be some other circuit such as, for instance, a multiplier, ALU, or some other logic circuit.

What is claimed is:

1. A field programmable gate array (FPGA), comprising:
one or more columns of multi-function tiles, each multi-function tile comprising:
a programmable switch to provide programmable interconnections to other tiles and other multifunction blocks, the programmable switch including input (IMUX) and output (OMUX) multiplexers;
an input data bus coupled to the IMUX;
an output data bus coupled to the OMUX;
a memory (RAM) having an input port coupled to the input data bus and an output port coupled to the output data bus; and
a multiplier having an input port coupled to the input data bus and an output port coupled to the output data bus, wherein first and second function blocks share routing resources of the multi-function block.

2. The FPGA of claim 1, wherein the input data bus comprises a first bus to carry a first data signal and a second bus to carry a second data signal, wherein:
the RAM includes a first input port coupled to the first bus and a second input port coupled to the second bus; and
the multiplier includes a first operand port coupled to the first bus and a second operand port coupled to the second bus.

3. The FPGA of claim 2, wherein during a write operation to the RAM when the RAM is in a first configuration, the RAM writes a number of least-significant bits (LSBs) from the first data signal and from the second data signal to selected addresses in the RAM while the multiplier simultaneously multiples a number of most significant bits (MSBS) from the first data signal with a number of MSBs from the second data signal to generate a product.

4. The FPGA of claim 3, wherein the number of LSBs from the first data signal comprises a first n-bit word to be written to the RAM and the number of MSBs from the first data signal comprises a first n-bit operand for the multiplier, and the number of LSBs from the second data signal comprises a second n-bit word to be written to the RAM and the number of MSBs from the second data signal comprises a second n-bit operand for the multiplier.

5. The FPGA of claim 4, wherein the first and second data signals each comprise 36 bits, the first and second word s each comprise 18 bits, and the first and second operands each comprise 18 bits.

6. The FPGA of claim 5, wherein the multiplier is a signed multiplier.

7. The FPGA of claim 3, wherein during a write operation to the RAM when the RAM is in a second configuration mode, the RAM writes the first and second data signals to selected addresses in the RAM.

8. The FPGA of claim 1, wherein the output data bus comprises a first output bus and a second output bus coupled between the OMUX and first and second output ports, respectively, of the RAM.

9. The FPGA of claim 8, wherein the output data bus further comprises:
a first bus multiplexer logic to selectively connect a first output port of the multiplier to the first output bus; and
a second bus multiplexer logic to selectively connect a second output port of the multiplier to the second output bus.

10. The FPGA of claim 9, wherein during a read operation to the RAM when the RAM is in a first configuration, the first bus multiplexer logic concatenates the MSBs of a product from the multiplier with a first output word from the RAM onto the first output bus, and the second bus multiplexer logic concatenates the LSBs of the product from the multiplier with a second output word from the RAM onto the second output bus.

11. The FPGA of claim 10, wherein the programmable switch further comprises a bus connected between the OMUX and the IMUX to route signals within the multi-function block without using circuitry external to the multi-function block.

12. The FPGA of claim 10, wherein the first and second output words each include 18 bits, and the MSBs and LSBs of the product each include 18 bits.

13. The FPGA of claim 10, wherein during a read operation to the RAM when the RAM is in a second configuration, the first bus multiplexer logic provides the first output word from the RAM onto the first output bus, and the second bus multiplexer logic provides the second output word from the RAM onto the second output bus.

14. The FPGA of claim 13, wherein the first and second output words each include 36 bits.

15. A method of sharing routing resources between a multiplier and a memory within a multi-function block of a field programmable gate array (FPGA), comprising:
providing first and second data signals to the multi-function block;
providing a number of bits from the first data signal to the memory as a first data word;
providing a number of bits from the first data signal to the multiplier as a first operand;
providing a number of bits from the second data signal to the memory as a second data word;
providing a number of bits from the second data signal to the multiplexer as a second operand;
writing the first and second data words to the memory; and
simultaneously multiplying the first and second operands in the multiplier to generate a product.

16. The method of claim 15, wherein the first and second data words each comprise 18 bits, and the first and second operands each comprise 18 bits.

17. The method of claim FPGA of claim 15, wherein the memory is a dual ported RAM.

18. The method of claim 15, wherein the multiplier is a signed multiplier.

19. The method of claim 15, further comprising:
reading first and second output words from first and second output ports, respectively, of the memory; and
selectively concatenating most-significant digits of the product with the first output word and selectively concatenating least-significant digits of the product with the second output word to facilitate simultaneous reading of data from the memory and product information from the multiplier.

* * * * *